United States Patent
Nagatomo

(10) Patent No.: US 12,301,209 B2
(45) Date of Patent: May 13, 2025

(54) ACOUSTIC WAVE DEVICE

(71) Applicant: Murata Manufacturing Co., Ltd., Nagaokakyo (JP)

(72) Inventor: Sho Nagatomo, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 243 days.

(21) Appl. No.: 18/087,864

(22) Filed: Dec. 23, 2022

(65) Prior Publication Data

US 2023/0127479 A1 Apr. 27, 2023

Related U.S. Application Data

(63) Continuation of application No. PCT/JP2021/025975, filed on Jul. 9, 2021.

(30) Foreign Application Priority Data

Jul. 15, 2020 (JP) ................. 2020-121454

(51) Int. Cl.
  *H03H 9/17* (2006.01)
  *H03H 9/02* (2006.01)
  *H03H 9/25* (2006.01)

(52) U.S. Cl.
  CPC ........ *H03H 9/171* (2013.01); *H03H 9/02015* (2013.01); *H03H 9/02102* (2013.01); *H03H 9/25* (2013.01)

(58) Field of Classification Search
  CPC ........ H03H 9/568; H03H 9/173; H03H 9/133; H03H 9/02031; H03H 9/564; H03H 9/171

(Continued)

(56) References Cited

U.S. PATENT DOCUMENTS

2008/0007139 A1* 1/2008 Kawamura ............ H03H 9/564
  310/313 B
2014/0152145 A1 6/2014 Kando et al.
(Continued)

FOREIGN PATENT DOCUMENTS

JP 05183376 A 7/1997
JP 2012257019 A 12/2012
(Continued)

OTHER PUBLICATIONS

International Search Report in PCT/JP2021/025975, mailed Oct. 5, 2021, 3 pages.
(Continued)

*Primary Examiner* — Rakesh B Patel
(74) *Attorney, Agent, or Firm* — Keating & Bennett, LLP

(57) ABSTRACT

An acoustic wave device includes a support substrate including a cavity portion and a support portion, a piezoelectric film on the support portion and including a first and second main surfaces, a functional electrode on the first main surface, and a heat dissipation film on at least one of the first and second main surfaces and includes a semiconductor or an insulator. The functional electrode includes at least one pair of first and second electrodes. When a thickness of the piezoelectric film is dx and a middle-to-middle distance between the first and second electrodes is p, dx/p is about 0.5 or less. The heat dissipation film overlaps at least a portion of the support portion in plan view. A thermal conductivity of the heat dissipation film is higher than a thermal conductivity of the piezoelectric film, and a thickness of the heat dissipation film is less than the thickness of the piezoelectric film.

20 Claims, 7 Drawing Sheets

(58) Field of Classification Search
USPC .................................................. 333/186–193
See application file for complete search history.

(56) References Cited

U.S. PATENT DOCUMENTS

2017/0187352 A1* 6/2017 Omura ..................... H03H 9/25
2019/0357381 A1* 11/2019 Maki .................. H03H 9/02834

FOREIGN PATENT DOCUMENTS

| WO | 2012073871 A1 | 6/2012 |
| WO | 2016147687 A1 | 9/2016 |

OTHER PUBLICATIONS

Written Opinion in PCT/JP2021/025975, mailed Oct. 5, 2021, 5 pages.

* cited by examiner

ACOUSTIC WAVE DEVICE

CROSS REFERENCE TO RELATED APPLICATIONS

This application claims the benefit of priority to Japanese Patent Application No. 2020-121454 filed on Jul. 15, 2020 and is a Continuation Application of PCT Application No. PCT/JP2021/025975 filed on Jul. 9, 2021. The entire contents of each application are hereby incorporated herein by reference.

BACKGROUND OF THE INVENTION

1. Field of the Invention

The present invention relates to an acoustic wave device.

2. Description of the Related Art

There is a conventionally known acoustic wave device that uses a plate wave propagating through a piezoelectric film made of $LiNbO_3$ or $LiTaO_3$. For example, Japanese Unexamined Patent Application Publication No. 2012-257019 discloses an acoustic wave device that uses a Lamb wave as a plate wave. In this device, the piezoelectric substrate is provided on a support body. The support body, that is, the support substrate, is provided with a cavity portion. The piezoelectric substrate overlaps the cavity portion. The piezoelectric substrate is made of $LiNbO_3$ or $LiTaO_3$. An IDT electrode is provided on the upper surface of the piezoelectric substrate. A voltage is applied across a plurality of electrode fingers connected to one electric potential of the IDT electrode and a plurality of electrode fingers connected to the other electric potential of the IDT electrode. This excites a Lamb wave. The reflectors are provided on both sides of the IDT electrode. This forms an acoustic wave resonator that uses a plate wave.

SUMMARY OF THE INVENTION

In the acoustic wave device described in Japanese Unexamined Patent Application Publication No. 2012-257019, the heat dissipation is low in the portion in which the piezoelectric substrate faces the cavity portion. Accordingly, the heat dissipation of the entire acoustic wave device is low. Here, when electric power is applied to the IDT electrode, heat is generated in the portion in which the IDT electrode is provided. When the heat dissipation is low as in the acoustic wave device described above, the acoustic wave device may be damaged by the heat generated in the portion in which the IDT electrode is provided. Accordingly, in the acoustic wave device having low heat dissipation, the electric power durability cannot be easily improved.

Preferred embodiments of the present invention provide acoustic wave devices that each achieve enhanced heat dissipation when a cavity portion is provided in a support substrate.

According to a broad aspect of a preferred embodiment of the present invention, an acoustic wave device includes a support substrate including a cavity portion and a support portion, a piezoelectric film on the support portion to cover the cavity portion, the piezoelectric film including a first main surface and a second main surface that face away from each other, a functional electrode on the first main surface of the piezoelectric film, and a heat dissipation film on at least one of the first main surface and the second main surface of the piezoelectric film, the heat dissipation film including a semiconductor or an insulator, wherein the functional electrode includes at least one pair of first and second electrodes that face each other, dx/p is about 0.5 or less where dx is a thickness of the piezoelectric film and p is a middle-to-middle distance between the first electrode and the second electrode that are adjacent to each other, and the heat dissipation film overlaps at least portion of the support portion in plan view, a thermal conductivity of the heat dissipation film is larger than a thermal conductivity of the piezoelectric film, and a thickness of the heat dissipation film is smaller than a thickness of the piezoelectric film.

According to a broad aspect of a preferred embodiment of the present invention, an acoustic wave device includes a support substrate including a cavity portion and a support portion, a piezoelectric film on the support portion to cover the cavity portion, the piezoelectric film including a first main surface and a second main surface that face away from each other, a functional electrode on the first main surface of the piezoelectric film, and a heat dissipation film on at least one of the first main surface and the second main surface of the piezoelectric film, in which the functional electrode includes at least one pair of first and second electrodes that face each other, dx/p is about 0.5 or less where dx is a thickness of the piezoelectric film and p is a middle-to-middle distance between the first electrode and the second electrode that are adjacent to each other, and the heat dissipation film overlaps at least portion of the support portion in plan view, a thickness of the heat dissipation film is smaller than a thickness of the piezoelectric film, and the heat dissipation film is a silicon film, a silicon nitride film, or a silicon carbide film.

In the acoustic wave devices according to preferred embodiments of the present invention, heat dissipation can be enhanced when a cavity portion is provided in a support substrate.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The present invention will be clarified below by describing specific preferred embodiments of the present invention with reference to the drawings.

It should be noted that the preferred embodiments described in the specification are exemplary and partial replacement or combination of the structures are possible among different preferred embodiments.

Figure 1:
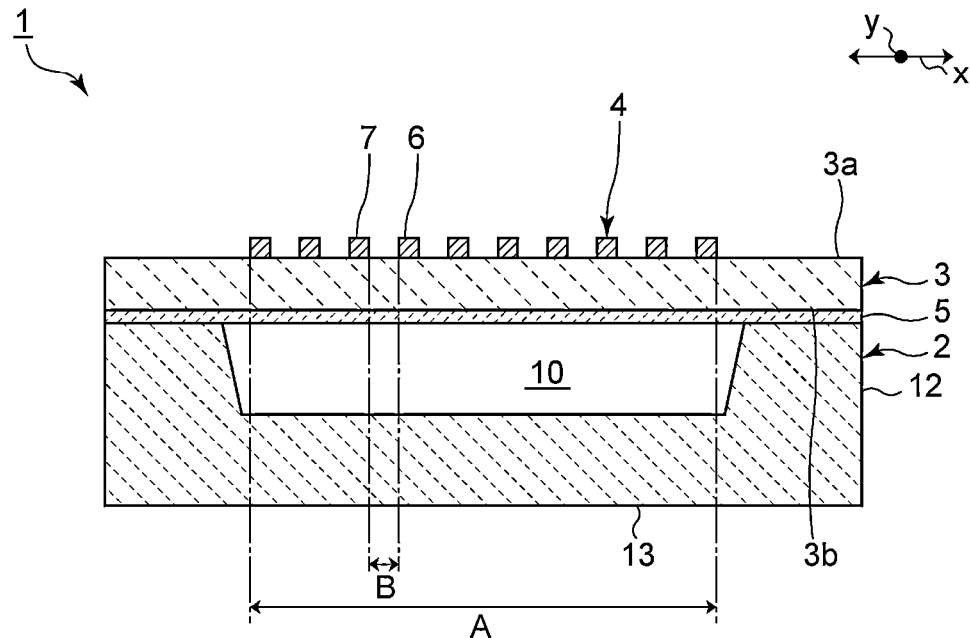
FIG. 1 is a front sectional view of an acoustic wave device according to a first preferred embodiment of the present invention.
Figure 2:
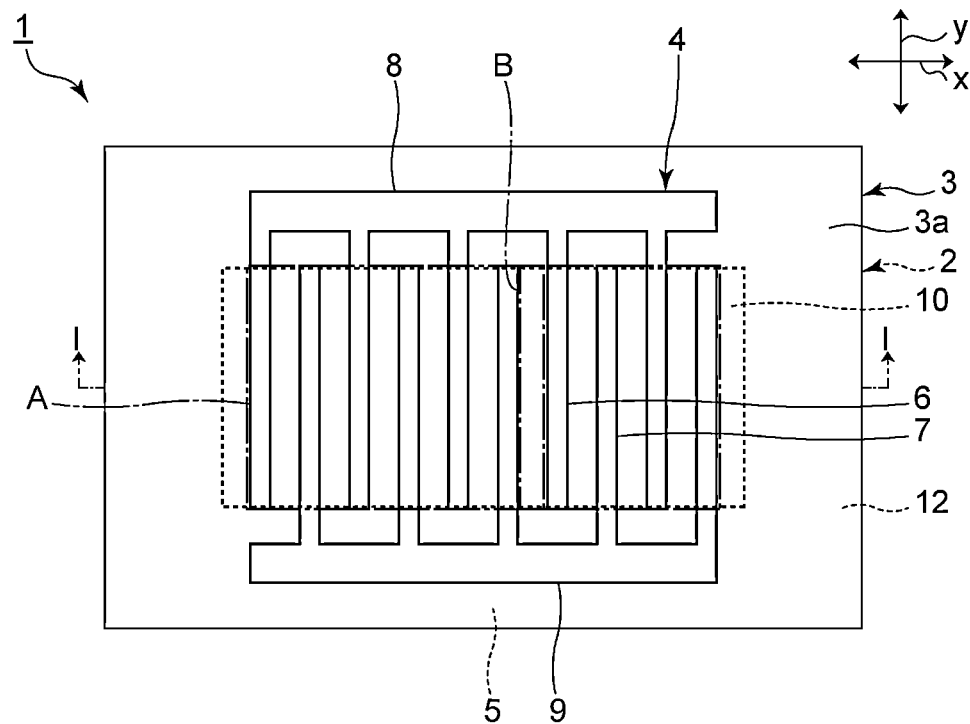
FIG. 2 is a plan view of the acoustic wave device according to the first preferred embodiment of the present invention.

FIG. 1 is a front sectional view of an acoustic wave device according to a first preferred embodiment of the present invention. FIG. 2 is a plan view of the acoustic wave device according to the first preferred embodiment. It should be noted that FIG. 1 is a sectional view taken along line I-I in FIG. 2.

As illustrated in FIG. 1, the acoustic wave device 1 includes a support substrate 2, a lithium niobate film 3 as a piezoelectric film, a functional electrode 4, and a heat dissipation film 5. The piezoelectric film according to a preferred embodiment the present invention is the lithium niobate film 3 in the acoustic wave device 1, but the piezoelectric film may be a lithium tantalate film. The lithium niobate film 3 is provided on the support substrate 2. It should be noted that the heat dissipation film 5 is provided between the support substrate 2 and the lithium niobate film 3 in the present preferred embodiment. The functional electrode 4 is provided on the lithium niobate film 3.

The support substrate 2 includes a cavity portion 10, a support portion 12, and a bottom portion 13. The support portion 12 has a frame shape. The cavity portion 10 is a recessed portion provided in the support substrate 2. The cavity portion 10 is surrounded by the support portion 12 and the bottom portion 13 and is open toward a lithium niobate film 3. It should be noted that the cavity portion 10 may be a through-hole.

The support substrate 2 is a silicon substrate. The plane orientation of the surface of the support substrate 2 close to the lithium niobate film 3 is preferably (100), (111), or (110). The resistivity of the support substrate 2 is preferably about 2 kΩ or more, for example. However, the material of the support substrate 2 is not limited to the silicon substrate described above. The material of the support substrate 2 preferably has a high thermal conductivity.

The lithium niobate film 3 is provided on the support portion 12 of the support substrate 2 to cover the cavity portion 10. The lithium niobate film 3 includes a first main surface 3a and a second main surface 3b. The first main surface 3a and the second main surface 3b face away from each other. The second main surface 3b of the first main surface 3a and the second main surface 3b is the main surface closer to the support substrate 2. In the present preferred embodiment, the lithium niobate film 3 is a $LiNbO_3$ film. The thickness of the lithium niobate film 3 is preferably not less than about 40 nm and not more than about 1000 nm, for example.

The heat dissipation film 5 is provided on the second main surface 3b of the lithium niobate film 3. The heat dissipation film 5 is provided to cover the cavity portion 10 of the support substrate 2. Accordingly, the heat dissipation film 5 is provided to bridge the support portion 12 of the support substrate 2. The thickness of the heat dissipation film 5 is smaller than the thickness of the lithium niobate film 3. The thermal conductivity of the heat dissipation film 5 is higher than the thermal conductivity of the lithium niobate film 3. The heat dissipation film 5 is made of a semiconductor or an insulator. More specifically, the material of the heat dissipation film 5 may be, for example, silicon, aluminum nitride, silicon carbide, diamond, boron nitride, nanocarbon, or the like.

It should be noted that the heat dissipation film 5 only needs to overlap at least portion of the support portion 12 of the support substrate 2 in plan view. In this specification, plan view refers to the view seen from above in FIG. 1.

As illustrated in FIG. 2, the functional electrode 4 is provided on the first main surface 3a of the lithium niobate film 3. The functional electrode 4 includes a plurality of electrodes. The plurality of electrodes are arranged in a direction intersecting the thickness direction of the lithium niobate film 3. These electrodes have a rectangular or substantially rectangular shape. The plurality of electrodes include a plurality of pairs of first and second electrodes 6 and 7. In the present preferred embodiment, the first electrodes 6 and the second electrodes 7 extend parallel or substantially parallel to each other. The first electrode 6 and the second electrode 7 that are adjacent to each other face each other in a direction orthogonal to the direction in which the first electrode 6 extends. In the following description, it is assumed that the direction in which the first electrode 6 extends is a Y-direction, and the direction orthogonal to the Y-direction is an X-direction. Both the X-direction and the Y-direction intersect the thickness direction of the lithium niobate film 3. Therefore, it can also be said that the first electrode 6 and the second electrode 7 that are adjacent to each other face each other in the direction intersecting the thickness direction of the lithium niobate film 3.

The functional electrode 4 includes a first busbar 8 and a second busbar 9. The first busbar 8 and the second busbar 9 face each other. One ends of the plurality of first electrodes 6 are connected to the first busbar 8. One ends of the plurality of second electrodes 7 are connected to the second busbar 9. The plurality of first electrodes 6 and the plurality of second electrodes 7 are interleaved with each other. The first electrodes 6 and the second electrodes 7 are connected to electric potentials that differ from each other. In the present preferred embodiment, the functional electrode 4 is the IDT electrode. However, the functional electrode 4 is not limited to the IDT electrode. The functional electrode 4 only needs to include at least one pair of first and second electrodes 6 and 7.

The functional electrode 4 is made of a metal or an alloy as appropriate, such as Al or AlCu alloy. The ratio of Cu to the AlCu alloy is preferably not less than about 1 wt % and not more than about 20 wt %, for example. The functional electrode 4 may be made of a laminated metal film. In this case, the functional electrode 4 may have, for example, a tie layer. The tie layer may be, for example, a Ti layer and a Cr layer.

As illustrated in FIG. 2, the functional electrode 4 includes an intersecting region A. The intersecting region A is a region in which adjacent electrodes overlap each other as seen in the X-direction. The intersecting region A is the region extending from one of the outermost electrodes in the X-direction of the functional electrode 4 to the other of the outermost electrodes. It should be noted that the intersecting region A includes the outer edges in the X-direction of the outermost electrodes. The entire intersecting region A overlaps the cavity portion 10 in plan view.

The present preferred embodiment has the following unique features. 1) When the thickness of the piezoelectric film is dx and the middle-to-middle distance between the first electrode 6 and the second electrode 7 that are adjacent to each other is p, dx/p is about 0.5 or less. 2) In plan view, the heat dissipation film 5 overlaps at least portion of the support portion 12 of the support substrate 2. 3) The thermal conductivity of the heat dissipation film 5 is higher than the thermal conductivity of the lithium niobate film 3, and the thickness of the heat dissipation film 5 is smaller than the thickness of the lithium niobate film 3. This can enhance the heat dissipation of the acoustic wave device 1 when the cavity portion 10 is provided in the support substrate 2. This will be described below.

The size of the acoustic wave device 1 can be reduced by using the bulk wave in the thickness shear mode. It should be noted that this reduction in the size will be described later. However, when the size of the acoustic wave device 1 is reduced, the heat dissipation is reduced because the surface area becomes smaller. In addition, when the cavity portion 10 is provided in the support substrate 2, the heat generated in the portion having the functional electrode 4 cannot be easily dissipated.

On the other hand, since the heat dissipation film 5 is provided in the present preferred embodiment, the heat generated in the portion having the functional electrode 4 can be transferred to the heat dissipation film 5. Furthermore, since the heat dissipation film 5 overlaps at least portion of the support portion 12 of the support substrate 2 in plan view, the distance between the heat dissipation film 5 and the support substrate 2 is small. Accordingly, the heat can be efficiently conducted from the heat dissipation film 5 to the support substrate 2. Accordingly, the heat dissipation of the acoustic wave device 1 can be enhanced when the cavity portion 10 is provided in the support substrate 2. Furthermore, since the thickness of the heat dissipation film 5 is smaller than the thickness of the lithium niobate film 3, the productivity can also be improved.

It should be noted that, even in a device that uses a conventional plate wave, the heat dissipation can be enhanced by increasing the size of the IDT electrode. However, when the size of the IDT electrode is increased, migration easily occurs in the electrode fingers. Accordingly, the electric power durability may degrade. On the other hand, in the present preferred embodiment, the heat dissipation can be enhanced without increasing the size of the functional electrode 4. Accordingly, the heat dissipation can be enhanced without degradation of electric power durability.

As in the present preferred embodiment, preferably, the heat dissipation film 5 is provided on the second main surface 3b of the lithium niobate film 3 and is in contact with the support substrate 2. This can further transfer the heat from the heat dissipation film 5 to the support substrate 2. More preferably, the heat dissipation film 5 is provided so as to bridge at least portion of the support portion 12 of the support substrate 2. This can further increase heat dissipation paths. Even more preferably, the heat dissipation film 5 overlaps the entire cavity portion 10 in plan view. In this case, the heat dissipation film 5 is provided to bridge of the entire support portion 12. Accordingly, heat dissipation paths can be further increased.

Here, the thermal conductivities of examples of materials that can be used for the heat dissipation film 5 are illustrated in Table 1. It should be noted that the thermal conductivity of $LiNbO_3$ is about 4.6 W/mK. The thermal conductivity of $LiTaO_3$ is about 4.2 W/mK.

TABLE 1

| Material | Thermal Conductivity (W/mK) |
| --- | --- |
| AlN | 130 to 260 |
| SiC | 360 |
| Si | 140 |
| Diamond | 2000 |
| BN | 550 |
| Nanocarbon | 2000 or less |

It can be seen that the thermal conductivities of all materials illustrated in Table 1 are significantly larger than the thermal conductivities of $LiNbO_3$ and $LiTaO_3$. The heat dissipation film 5 is preferably a silicon film, a silicon nitride film, or a silicon carbide film. More specifically, the heat dissipation film 5 is preferably a Si film, an AlN film, or a SiC film. In this case, the heat dissipation can be enhanced and the cost can be reduced.

The thermal conductivity of the heat dissipation film 5 is preferably equal to or more than five times the thermal conductivity of the lithium niobate film 3. This can effectively enhance the heat dissipation. However, when any of the materials illustrated in Table 1 are used for the heat dissipation film 5, the thermal conductivity of the heat dissipation film 5 can be significantly increased and the heat dissipation can be further enhanced. This is also true when the piezoelectric film is a lithium tantalate film.

Figure 3:
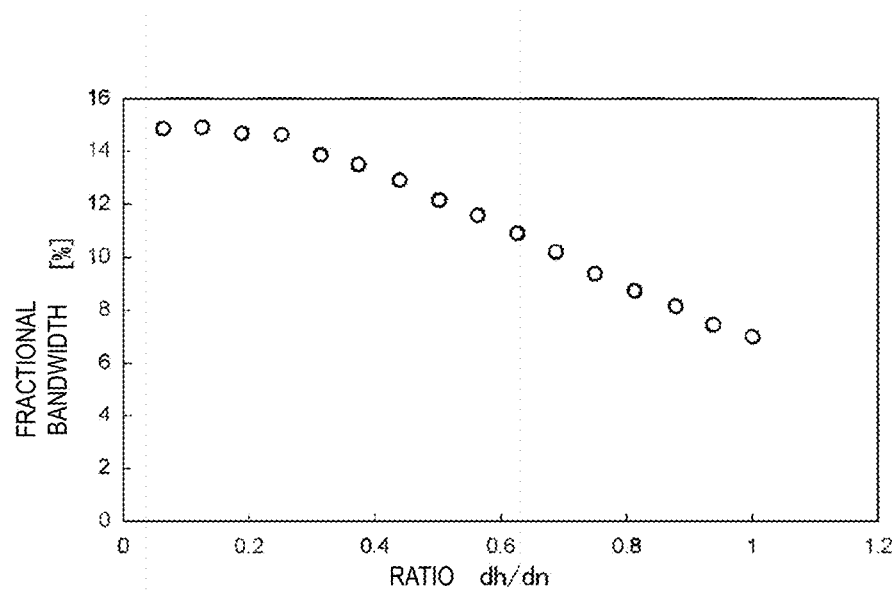
FIG. 3 is a diagram illustrating the relationship between the ratio dh/dn of the thickness of a heat dissipation film to the thickness of a lithium niobate film and the fractional bandwidth.

Here, it is assumed that the thickness of the heat dissipation film 5 is dh, the thickness of the lithium niobate film 3 is dn, and the ratio of the thickness dh of the heat dissipation film 5 to the thickness dn of the lithium niobate film 3 is dh/dn. FIG. 3 illustrates the relationship between the ratio dh/dn and the fractional bandwidth. When the fractional bandwidth is large, the coupling coefficient is large.

FIG. 3 is a diagram illustrating the relationship between the fractional bandwidth and the ratio (dh/dn) of the thickness of the heat dissipation film to the thickness of the lithium niobate film.

It can be seen from FIG. 3 that the smaller the ratio dh/dn, the wider the fractional bandwidth. The ratio dh/dn is preferably about 0.25 or less. That is, the thickness of the heat dissipation film 5 is preferably about 25% or less of the thickness of the lithium niobate film 3. More specifically, the thickness of the thickest portion of the heat dissipation film 5 is preferably about 25% or less of the thickness of the lithium niobate film 3. This can further widen the fractional bandwidth and further increase the coupling coefficient. On the other hand, the thickness of the heat dissipation film 5 is preferably about 5% or more of the thickness of the lithium niobate film 3. In this case, the heat dissipation can be preferably enhanced. The thickness of the heat dissipation film 5 is more preferably about 50% or more of the thickness of the lithium niobate film 3. In this case, the heat dissipation can be further enhanced. It should be noted that the fractional bandwidth may also be referred to as the fractional band in the following description.

By the way, the reflector is not provided on the lithium niobate film 3 in the present preferred embodiment. The acoustic wave device 1 does not have the reflectors. The reason why the propagation loss is suppressed in this case as well is that the acoustic wave device 1 uses a bulk wave in the thickness shear mode. More specifically, the acoustic wave device 1 uses a bulk wave in a thickness shear first-order mode. The details of the thickness shear mode used by the acoustic wave device 1 will be described below.

As illustrated in FIG. 2, a plurality of pairs of first and second electrodes 6 and 7 that are adjacent to each other are provided in the X-direction. The number of pairs does not need to be an integer but may be a 1.5, 2.5, or the like. It should be noted that electrodes that are adjacent to each other in the functional electrode 4 are not electrodes disposed in direct contact with each other, but electrodes spaced apart from each other. In addition, when the first electrode 6 and the second electrode 7 are adjacent to each other, no other hot electrode or ground electrode is disposed between the first electrode 6 and the second electrode 7.

When the acoustic wave device 1 is driven, an AC voltage is applied across the plurality of first electrodes 6 and the plurality of second electrodes 7. More specifically, an AC voltage is applied across the first busbar 8 and the second busbar 9. This can obtain the resonance characteristics using the bulk wave in the thickness shear mode excited in the lithium niobate film 3. As described above, the region between the first electrode 6 and the second electrode 7 is an excitation region B. FIG. 2 illustrates one excitation region B as an example, but all regions between the plurality of first electrodes 6 and the plurality of second electrodes 7 are the excitation regions B. The excitation regions B are included in the intersecting region A.

The heat dissipation film 5 preferably overlaps the intersecting region A in plan view and more preferably overlaps the excitation regions B in plan view. In the acoustic wave device 1, heat is generated in the excitation regions B of the intersecting region A. Accordingly, in the structure described above, heat can be efficiently conducted to the heat dissipation film 5 from the portion in which heat is generated. Therefore, the heat dissipation can be further enhanced.

In the acoustic wave device 1, dx/p is about 0.5 or less as described above. More specifically, when the thickness of the lithium niobate film 3 is dn and the middle-to-middle distance between the first electrode 6 and the second electrode 7 that are adjacent to each other of the plurality of pairs of first and second electrodes 6 and 7 is p, dn/p is about 0.5 or less. Accordingly, the bulk wave in the thickness shear mode is effectively excited and good resonance characteristics can be obtained. Here, the middle-to-middle distance between the first electrode 6 and the second electrode 7 indicates the distance between the middle in the X-direction of the first electrode 6 and the middle in the X-direction of the second electrode 7.

The acoustic wave device 1 has the structure described above and uses the thickness shear mode. Accordingly, the Q value is less likely to decrease even when the number of pairs of first and second electrodes 6 and 7 decreases.

In the present preferred embodiment, the lithium niobate film 3 is a Z-cut piezoelectric film. Accordingly, the X-direction is orthogonal to the polarization direction of the lithium niobate film 3. This does not apply when the lithium niobate film 3 is a piezoelectric film with another cut angle.

The difference between the bulk wave in the thickness shear mode and the conventionally used Lamb wave will be described with reference to FIGS. 4A and 4B.

Figure 4A:
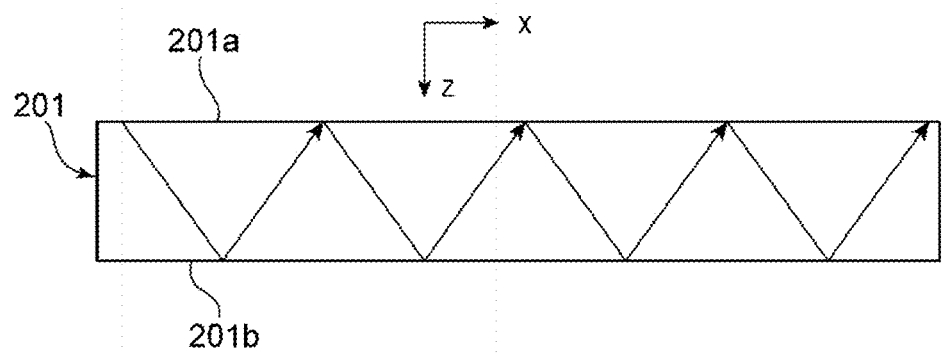
FIG. 4A is a front sectional view schematically illustrating a Lamb wave propagating through a piezoelectric film of a conventional acoustic wave device.

FIG. 4A is a front sectional view schematically illustrating a Lamb wave propagating through a piezoelectric film of the conventional acoustic wave device as described in Japanese Unexamined Patent Application Publication No. 2012-257019. Here, the wave propagates through the piezoelectric film 201 as indicated by arrows. In the piezoelectric film 201, the first main surface 201a and the second main surface 201b face away from each other, and the thickness direction connecting the first main surface 201a and the second main surface 201b to each other is the Z-direction. The X-direction is the direction in which the electrode fingers of the IDT electrode are arranged. As illustrated in FIG. 4A, the Lamb wave propagates in the X-direction. Since the Lamb wave is a plate wave, the piezoelectric film 201 vibrates as a whole, but the wave propagates in the X-direction. Accordingly, the resonance characteristics are obtained by disposing the reflectors on both sides in the X-direction of the IDT electrode.

Figure 4B:
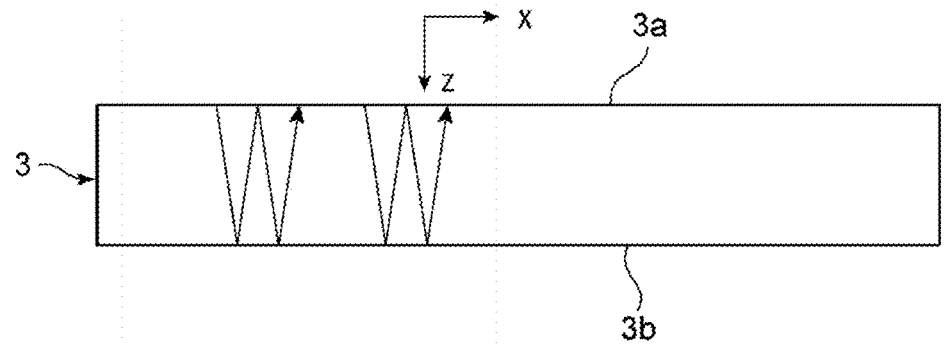
FIG. 4B is a front sectional view schematically illustrating a bulk wave in a thickness shear mode propagating through the piezoelectric film of the acoustic wave device according to a preferred embodiment of the present invention.

On the other hand, as illustrated in FIG. 4B, in the acoustic wave device according to the present preferred embodiment, vibration is displaced in the thickness shear direction. Therefore, the wave propagates substantially in the Z-direction and resonates. Accordingly, the X-direction component of the wave is significantly smaller than the Z-direction component thereof. Since resonance characteristics are obtained by propagation of the wave in the Z-direction, propagation loss is less likely to occur even when the number of electrode fingers of the reflectors is reduced. Furthermore, even when the number of pairs of electrodes including the first electrode 6 and the second electrode 7 is reduced for size reduction, the Q value is less likely to decrease.

Figure 5:
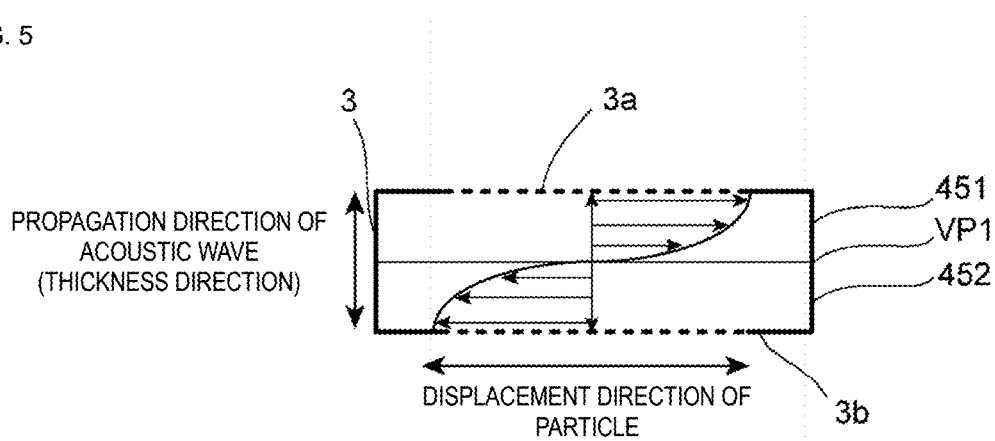
FIG. 5 is a diagram illustrating the amplitude direction of the bulk wave in the thickness shear mode.

It should be noted that the amplitude direction of the bulk wave in the thickness shear mode in a first region 451 included in the excitation region of the lithium niobate film 3 is opposite to the amplitude direction of the bulk wave in the thickness shear mode in a second region 452 included in the excitation region, as illustrated in FIG. 5. FIG. 5 schematically illustrates the bulk wave when a voltage that makes the electric potential of the second electrode 7 higher than the electric potential of the first electrode 6 is applied across the first electrode 6 and the second electrode 7. The first region 451 is a region of the excitation region between a virtual plane VP1 that is orthogonal to the thickness direction of the lithium niobate film 3 and bisects the lithium niobate film 3 and the first main surface 3a. The second region 452 is a region of the excitation region between the virtual plane VP1 and the second main surface 3b.

As described above, the acoustic wave device 1 includes the plurality of pairs of first and second electrodes 6 and 7. Since the thickness shear mode does not propagate the wave in the X-direction, the plurality of pairs of first and second electrodes 6 and 7 do not need to be provided. That is, at least one pair of first and second electrodes 6 and 7 only needs to be provided.

In the acoustic wave device 1, the first electrode 6 is connected to the hot potential and the second electrode 7 is connected to the ground potential. However, the first electrode 6 may be connected to the ground potential and the second electrode 7 may be connected to the hot potential. In the present preferred embodiment, at least one pair of electrodes is connected to the hot potential or connected to the ground potential as described above and no floating electrodes are provided.

For example, dn/p is about 0.5 or less in the present preferred embodiment. Preferably, dn/p is about 0.24 or less, for example. In this case, better resonance characteristics can be obtained. This will be described with reference to FIG. 6.

Figure 6:
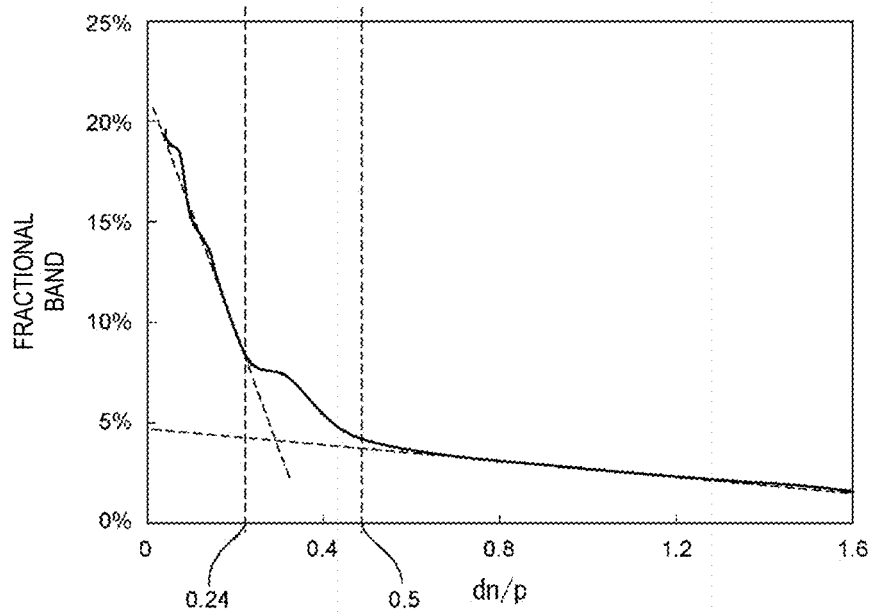
FIG. 6 is a diagram illustrating the relationship between dn/p and a fractional band as a resonator when the middle-to-middle distance between a first electrode and a second electrode that are adjacent to each other is p and the thickness of the piezoelectric film is dn.

A plurality of acoustic wave devices have been obtained by changing dn/p. FIG. 6 is a diagram illustrating the relationship between dn/p and the fractional band as a resonator of the acoustic wave device.

As is clear from FIG. 6, when dn/p>about 0.5, the fractional band is less than about 5% even if dn/p is adjusted. On the other hand, when dn/p≤about 0.5, the fractional band can be about 5% or more by changing dn/p within this range. Accordingly, a resonator having a high coupling coefficient can be obtained. Alternatively, when dn/p is about 0.24 or less, the fractional band can be increased to about 7% or more. In addition, a resonator having a wider fractional band can be obtained by adjusting dn/p within this range, thus achieving a resonator with a higher coupling coefficient. For example, when the lithium niobate film 3 has variations in the thickness, a value obtained by averaging the thickness may be adopted. These relationships are also true when the piezoelectric film is a lithium tantalate film.

The middle-to-middle distance p between the first electrode 6 and the second electrode 7 that are adjacent to each other is preferably not less than about 1 μm and not more than about 10 μm. When it is assumed that the dimension in the X-direction of the plurality of electrodes of the functional electrode 4 is the width, the widths of the first electrode 6 and the second electrode 7 are preferably not less than about 150 nm and not more than about 1000 nm.

Here, the relationship between the thermal conductivity ratio to be defined below and the heat dissipation will be described. It is assumed that the average of the widths of the first electrode and the second electrode is w, the duty ratio of the functional electrode is De, the thermal conductivity of the functional electrode is Ce, and the thickness of the functional electrode is de. It should be noted that De=w/p. It is assumed that the thermal conductivity of the lithium niobate film is Cn, the thickness of the lithium niobate film is dn, the thermal conductivity of the heat dissipation film is Ci, and the thickness of the heat dissipation film is di. It is assumed that the thermal conductivity ratio of the functional electrode to the thermal conductivity ratio of the lithium niobate film and the heat dissipation film is R and the R=(Ce×de×De)/(Cn×dn+Ci×di) is satisfied. For example, when the thermal conductivity Ci of the heat dissipation film is high or the thickness of the heat dissipation film large, the thermal conductivity ratio R is small.

It should be noted that the normalized temperature difference is used as an index of the heat dissipation. The normalized temperature difference is obtained by normalizing the difference between the temperature when an acoustic wave is not excited and the temperature when an acoustic wave is excited in the acoustic wave device. When an acoustic wave is excited, heat is generated in the portion in which the functional electrode is provided and the temperature of the acoustic wave device rises.

On the other hand, the higher the heat dissipation of the acoustic wave device, the more heat dissipated. Accordingly, the higher the heat dissipation, the smaller the difference between the temperature when an acoustic wave is not excited and the temperature when an acoustic wave is excited. Accordingly, the smaller the normalized temperature difference, the higher the heat dissipation of the acoustic wave device.

Figure 7:
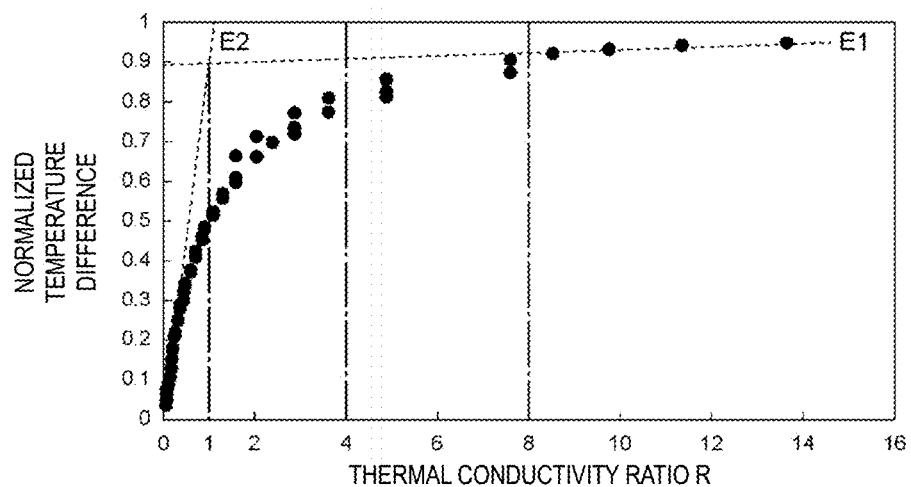
FIG. 7 is a diagram illustrating the relationship between the thermal conductivity ratio and the normalized temperature difference.

FIG. 7 is a diagram illustrating the relationship between the thermal conductivity ratio and the normalized temperature difference. The dashed line E1 and the dashed line E2 in FIG. 7 indicate the slope of the change in the normalized temperature difference with respect to the change in the thermal conductivity ratio R.

As illustrated in FIG. 7, it can be seen that the smaller the thermal conductivity ratio R, the smaller the normalized temperature difference. Here, it can be seen that, when the thermal conductivity ratio R is decreasing, the normalized temperature difference starts decreasing significantly at R=8. When R≤4, the normalized temperature difference further decreases. It should be noted that, the smaller the thermal conductivity ratio R, the larger the slope of the change in the normalized temperature difference with respect to the change in the thermal conductivity ratio R. Here, as indicated by the intersection point of the dashed line E1 and the dashed line E2, the inflection point of change in the normalized temperature difference is observed at R=1. Accordingly, the normalized temperature difference can even further decrease when R≤1.

R≤8 is preferred, R≤4 is more preferred, and R≤1 is even more preferred. This can effectively reduce the normalized temperature difference and effectively enhance the heat dissipation.

As described above, the heat dissipation film 5 only needs to overlap at least portion of the support portion 12 of the support substrate 2 in plan view. The following describes a modification of the first preferred embodiment in which only the arrangement of the heat dissipation film is different from that in the first preferred embodiment.

Figure 8:
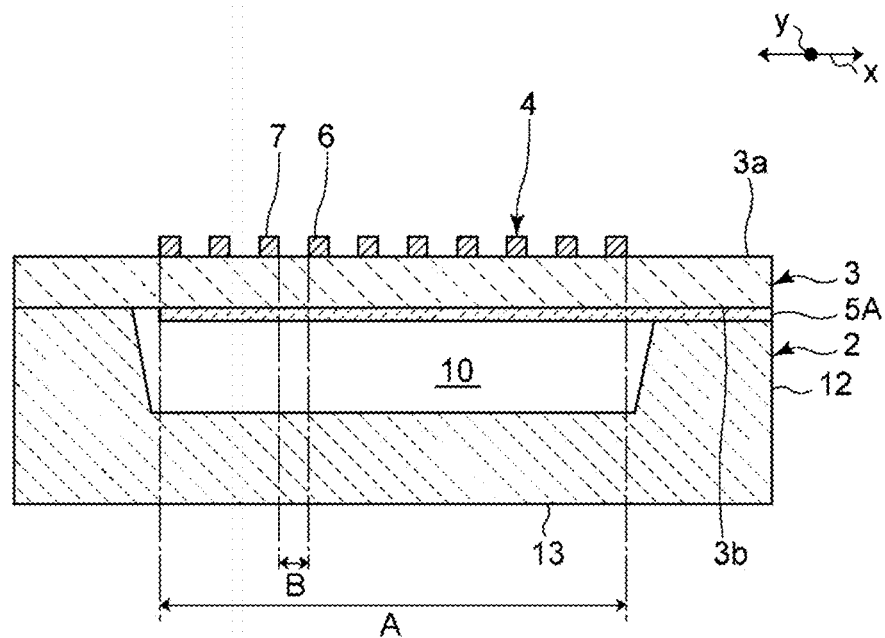
FIG. 8 is a front sectional view of an acoustic wave device according to a modification of the first preferred embodiment of the present invention.

In the modification illustrated in FIG. 8, the heat dissipation film 5A overlaps a portion of the support portion 12 of the support substrate 2 in plan view. More specifically, in the cross section illustrated in FIG. 8, one of the portions of the support portion 12 that face each other overlaps the heat dissipation film 5A in plan view. The other of the portions of the support portion 12 that face each other does not overlap the heat dissipation film 5A in plan view. The portion of the support portion 12 that does not overlap the heat dissipation film 5A is in direct contact with the lithium niobate film 3. It should be noted that the heat dissipation film 5A also overlaps the intersecting region A of the functional electrode 4 in plan view. In this modification as well, the heat dissipation can be enhanced as in the first preferred embodiment.

Figure 9:
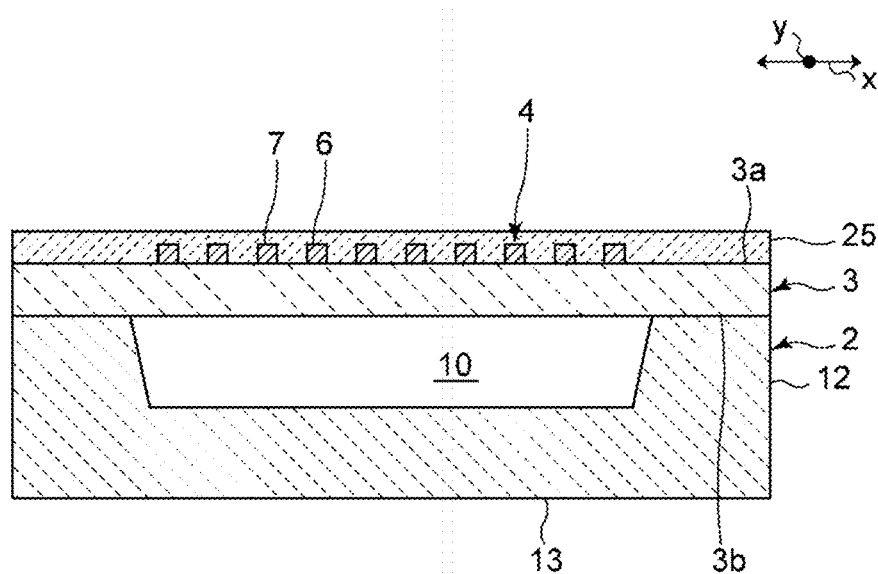
FIG. 9 is a front sectional view of an acoustic wave device according to a second preferred embodiment of the present invention.

FIG. 9 is a front sectional view of an acoustic wave device according to a second preferred embodiment.

The second preferred embodiment differs from the first preferred embodiment in that a heat dissipation film 25 is provided on the first main surface 3a of the lithium niobate film 3. It should be noted that the heat dissipation film 5 is not provided on the second main surface 3b. The acoustic wave device according to the second preferred embodiment has the same structure as the acoustic wave device 1 according to the first preferred embodiment with the exception of the points described above.

The heat dissipation film 25 is provided on the first main surface 3a of the lithium niobate film 3 to cover the functional electrode 4. It should be noted that the thickness of the heat dissipation film 25 is smaller than the thickness of the lithium niobate film 3 in the second preferred embodiment as well. The heat dissipation film 25 overlaps the support portion 12 of the support substrate 2 in plan view.

The thermal conductivity of the lithium niobate film 3 is low. Accordingly, it is difficult to increase the efficiency of heat transfer from the portion of the lithium niobate film 3 in which the functional electrode 4 is provided to the portion in contact with the support portion 12. On the other hand, in the second preferred embodiment, heat can be efficiently transferred to the portion that overlaps the support portion 12 in plan view via the heat dissipation film 25. Accordingly, the heat dissipation can be enhanced.

Even when the heat dissipation film 25 is provided on the first main surface 3a of the lithium niobate film 3, the heat dissipation film 25 preferably overlaps the entire cavity portion 10 in plan view. This can increase heat dissipation paths. Accordingly, the heat dissipation can be effectively enhanced.

Figure 10:
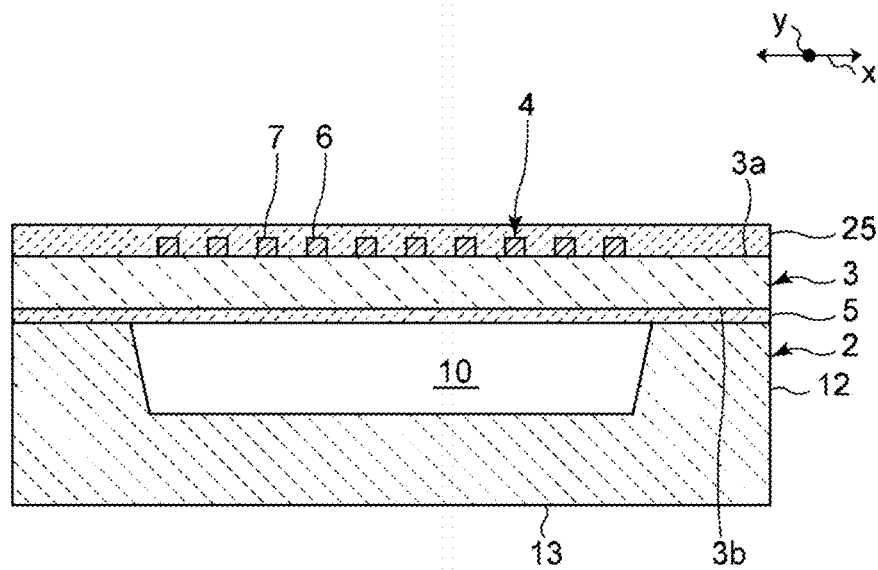
FIG. 10 is a front sectional view of an acoustic wave device according to a third preferred embodiment of the present invention.

FIG. 10 is a front sectional view of an acoustic wave device according to a third preferred embodiment.

The third preferred embodiment differs from the first preferred embodiment in that the heat dissipation film 25 is provided on the first main surface 3a of the lithium niobate film 3 and the heat dissipation film 5 is provided on the second main surface 3b. The acoustic wave device according to the third preferred embodiment has the same structure as the acoustic wave device 1 according to the first preferred embodiment with the exception of the points described above.

In the third preferred embodiment as well, heat can be efficiently transmitted to the support substrate 2 via the heat dissipation film 5 and the heat dissipation film 25 as in the first preferred embodiment and the second preferred embodiment. Accordingly, the heat dissipation can be enhanced.

Figure 11:
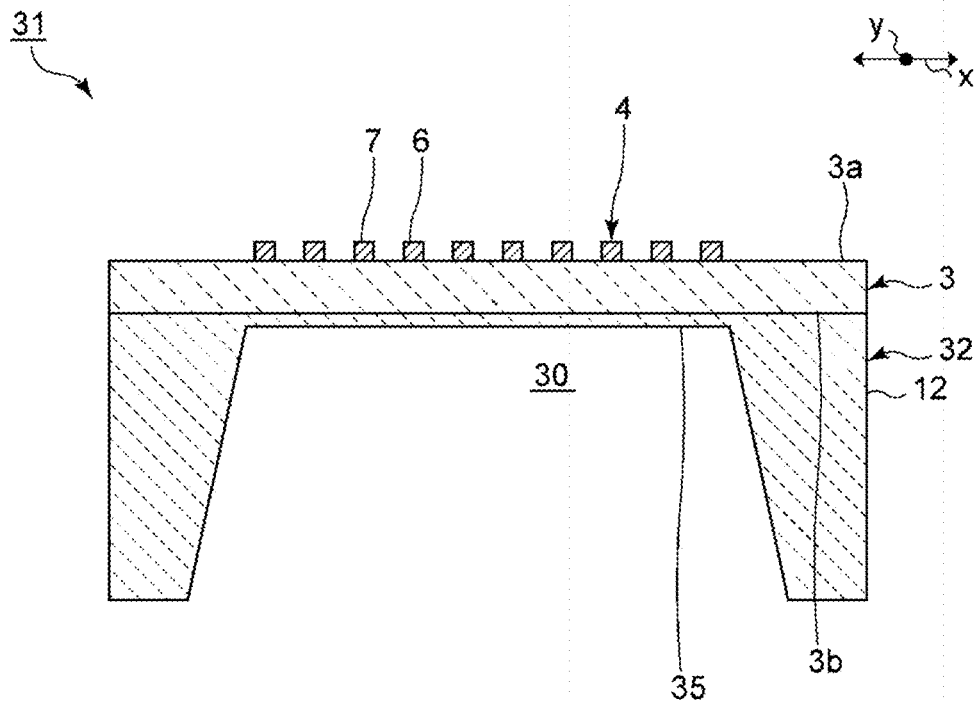
FIG. 11 is a front sectional view of an acoustic wave device according to a fourth preferred embodiment of the present invention.

FIG. 11 is a front sectional view of an acoustic wave device according to a fourth preferred embodiment.

The fourth preferred embodiment differs from the first preferred embodiment in that the heat dissipation film 35 and the support substrate 32 are provided integrally with each other and the cavity portion 30 has a different shape. The acoustic wave device 31 according to the fourth preferred embodiment has the same structure as the acoustic wave device 1 according to the first preferred embodiment with the exception of the points described above.

In the acoustic wave device 31, the material of the heat dissipation film 35 is the same as the material of the support substrate 32. The heat dissipation film 35 bridges the support portion 12 of the support substrate 32. In the fourth preferred embodiment, the heat dissipation film 35 bridges the entire support portion 12. The heat dissipation film 35 is flush with the support portion 12 on a side of the lithium niobate film 3. The heat dissipation film 35 and the support portion 12 are in contact with the second main surface 3b of the lithium niobate film 3.

The cavity portion 30 of the support substrate 32 is a recessed portion provided in the support substrate 32. More specifically, the cavity portion 30 is a recessed portion surrounded by the support portion 12 and the heat dissipation film 35. The support substrate 32 according to the fourth preferred embodiment does not have the bottom portion 13 as described in the first preferred embodiment. The cavity portion 30 is a recessed portion that is open on a side facing the heat dissipation film 35.

In the fourth preferred embodiment, the heat dissipation film 35 and the support substrate 32 are integrated with each other. This can efficiently dissipate heat to the outside of the acoustic wave device 31 via the heat dissipation film 35 and the support substrate 32. Accordingly, the heat dissipation can be further enhanced.

The heat dissipation film 35 and the support substrate 32 are obtained by, for example, etching the base material of the support substrate 32. For example, the base material may be etched after the portion of the base material in which the heat dissipation film 35 is not formed is masked with a resist film or the like. Alternatively, the etching rate of the portion of the base material in which the heat dissipation film 35 is formed may differ from the etching rate of the other portion. For example, the base material only needs to be doped as appropriate to change the etching rate. Etching may be performed after that.

It should be noted that, when the base material is doped in forming the heat dissipation film 35, the composition of the heat dissipation film 35 differs from the composition of the support portion 12 of the support substrate 32. Even in this case, however, the composition of the heat dissipation film 35 is the same as the composition of the support portion 12 with the exception of the component used for the doping.

By the way, the heat dissipation film 35 does not necessarily have to bridge the support portion 12. The heat dissipation film 35 only needs to be provided integrally with at least portion of the support portion 12. In this case as well, the heat dissipation can be enhanced. However, the heat dissipation film 35 preferably bridges at least portion of the support portion 12 and more preferably bridges the entire support portion 12. This can further enhance the heat dissipation.

Figure 12:
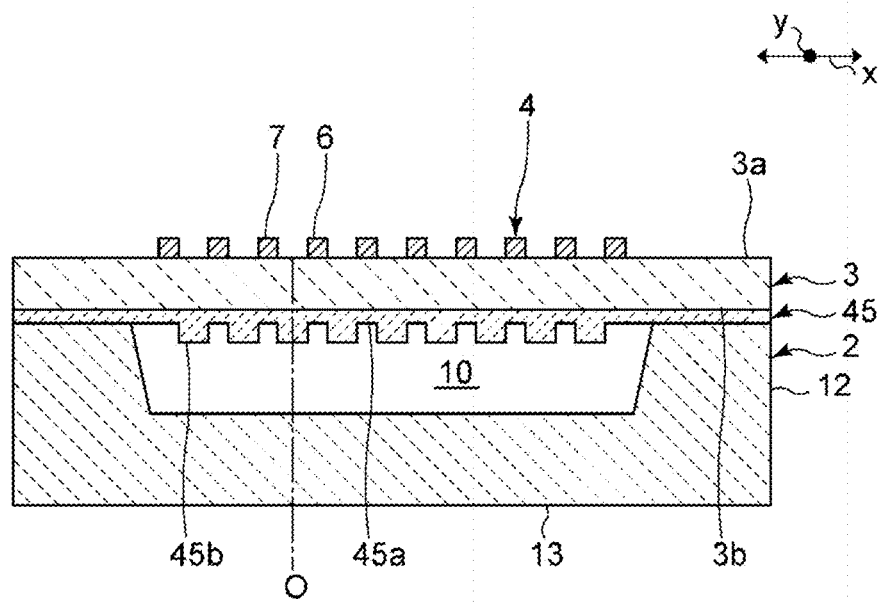
FIG. 12 is a front sectional view of an acoustic wave device according to a fifth preferred embodiment of the present invention.

FIG. 12 is a front sectional view of an acoustic wave device according to a fifth preferred embodiment.

The fifth preferred embodiment differs from the first preferred embodiment in the structure of the heat dissipation film 45. The acoustic wave device according to the fifth preferred embodiment has the same structure as the acoustic wave device 1 according to the first preferred embodiment with the exception of the point described above.

The heat dissipation film 45 has a first portion 45a and a second portion 45b. The first portion 45a overlaps the first electrode 6 or the second electrode 7 in plan view. The second portion 45b overlaps a portion between the first electrode 6 and the second electrode 7 in plan view. It should be noted that the second portion 45b does not overlap the first electrode 6 and the second electrode 7 in plan view. The thickness of the second portion 45b is larger than the thickness of the first portion 45a. It should be noted that the thickness of at least portion of the second portion 45b only needs to be larger than the thickness of the first portion 45a.

When a conventional plate wave or the like is used as the acoustic wave, heat is generated in the portion in which the electrode fingers of the IDT electrode are provided. On the other hand, when the bulk wave in the thickness shear mode is used as in the fifth preferred embodiment, heat is generated in the portion of the lithium niobate film 3 between the portions in which the first electrode 6 and the second electrode 7 are provided. The second portion 45b of the heat dissipation film 45 is in contact with this portion in which heat is generated. Since the thickness of the second portion 45b is large, heat can be efficiently conducted to the support substrate 2 from the portion in which heat is generated. In addition, since the first portion 45a and the second portion 45b form unevenness, the surface area of the heat dissipation film 45 can be increased. Accordingly, the heat dissipation can be further enhanced.

It is assumed that the middle in the X-direction between the middle in the X-direction of the first electrode 6 and the middle in the X-direction of the second electrode 7 is a middle portion O between electrode fingers. The thickness of a portion including a portion of the second portion 45b that overlaps the middle portion O between electrode fingers in plan view is preferably larger than the thickness of the first portion 45a. Heat is generated particularly in the portion of the lithium niobate film 3 that is located in the middle portion O between electrode fingers. Since the thickness of the portion of the heat dissipation film 45 described above is large, the heat dissipation can be enhanced more effectively.

Examples of preferred Euler angles ($\varphi$, $\theta$, $\psi$) for the lithium niobate film 3 will be illustrated below.

Figure 13:
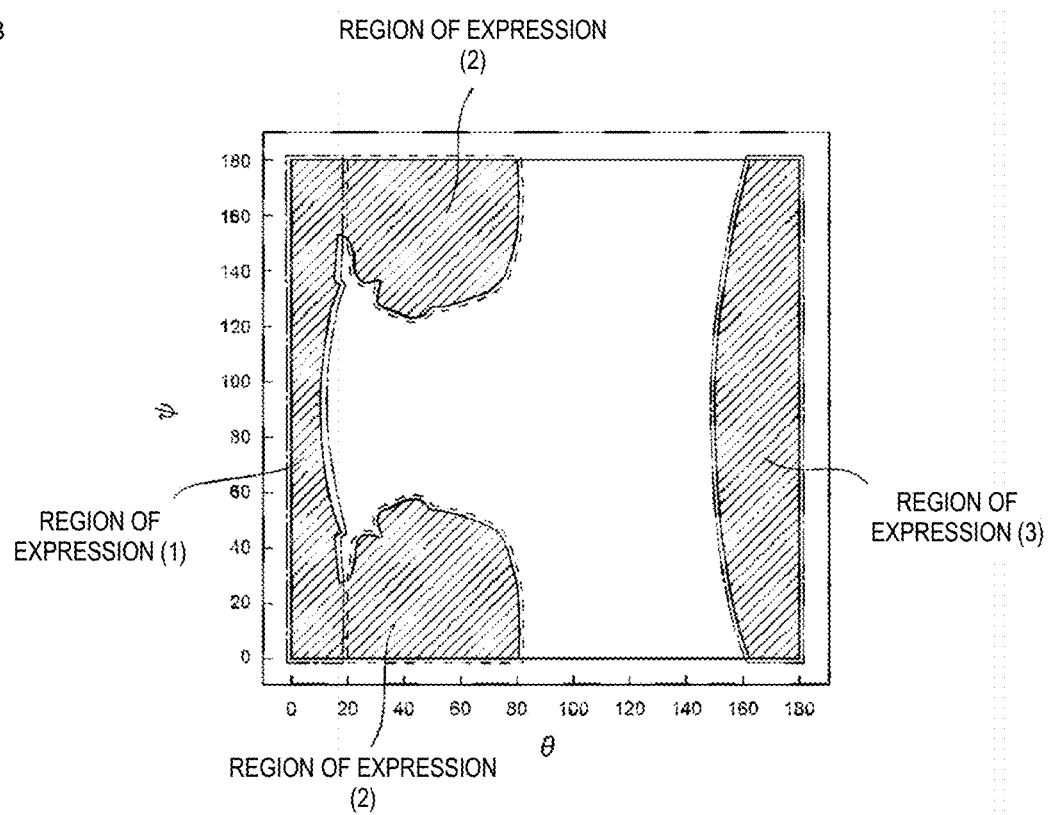
FIG. 13 is a diagram illustrating a map of the fractional band with respect to the Euler angles (0°, θ, ψ) of $LiNbO_3$ when dn/p is brought as close to 0 as possible.

FIG. 13 is a diagram illustrating a map of the fractional band with respect to the Euler angles (0°, $\theta$, $\psi$) of $LiNbO_3$ when dn/p is brought as close to 0 as possible. The hatched portions in FIG. 13 are the regions in which an approximately 5% or more fractional band is obtained and the ranges represented by expression (1), expression (2), and expression (3) are obtained by approximation of the ranges of the regions.

$$(0°±10°, 0° \text{ to } 20°, \text{any } \psi) \quad \text{Expression (1)}$$

$$(0°±10°, 20° \text{ to } 80°, 0° \text{ to } 60°(1-(\theta-50)^2/900)^{1/2}) \text{ or}$$
$$(0°±10°, 20° \text{ to } 80°, [180°-60°(1-(\theta-50)^2/900)^{1/2}] \text{ to } 180°) \quad \text{Expression (2)}$$

$$(0°±10°, [180°-30°(1-(\psi-90)^2/8100)^{1/2}] \text{ to } 180°, \text{any } \psi) \quad \text{Expression (3)}$$

Accordingly, in the case of the Euler angle range of expression (1), expression (2), or expression (3) is preferable because the fractional band can be sufficiently widened. This relationship is also true of the lithium tantalate film.

It is known that the relationship in FIG. 3 is established similarly when the piezoelectric film is the lithium tantalate film. Accordingly, the thickness of the heat dissipation film is preferably about 25% or less of the thickness of the lithium tantalate film. This can further expand the fractional bandwidth and further increase the coupling coefficient. On the other hand, the thickness of the heat dissipation film is preferably about 5% or more of the lithium tantalate film and, more preferably, about 50% or more of the lithium tantalate film. In this case, the heat dissipation can be further enhanced.

Furthermore, it is known that the relationship in FIG. 7 is established similarly when the piezoelectric film is the lithium tantalate film. It is assumed that, when the piezoelectric film is the lithium tantalate film or the lithium niobate film, the thermal conductivity of the piezoelectric film is Cx and the thickness of the piezoelectric film is dx. It is assumed that the thermal conductivity ratio of the functional electrode to the piezoelectric film and the heat dissipation film is Rx and Rx=(Ce×de×De)/(Cx×dx+Ci×di) is satisfied. Similar to the above, Rx≤8 is preferred, Rx≤4 is more preferred, and Rx≤1 is even more preferred. This can effectively reduce the normalized temperature difference and effectively enhance the heat dissipation.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
a support substrate including a cavity portion and a support portion;
a piezoelectric film provided on the support portion to cover the cavity portion and including a first main surface and a second main surface that face away from each other;
a functional electrode on the first main surface of the piezoelectric film; and
a heat dissipation film on at least one of the first main surface and the second main surface of the piezoelectric film, the heat dissipation film including a semiconductor or an insulator; wherein
the functional electrode includes at least one pair of first and second electrodes that face each other, dx/p is about 0.5 or less where dx is a thickness of the piezoelectric film and p is a middle-to-middle distance between the first electrode and the second electrode that are adjacent to each other, and the heat dissipation film overlaps at least portion of the support portion in plan view, a thermal conductivity of the heat dissipation film is higher than a thermal conductivity of the piezoelectric film, and a thickness of the heat dissipation film is smaller than a thickness of the piezoelectric film;
the piezoelectric film is a lithium niobate film or a lithium tantalate film; and
R≤8 is satisfied when the middle-to-middle distance between the first electrode and the second electrode that are adjacent to each other is p, an average of widths of the first electrode and the second electrode is w, a duty ratio of the functional electrode is De, a thermal conductivity of the functional electrode is Ce, a thickness of the functional electrode is de, the thermal conductivity of the piezoelectric film is Cx, the thickness of the piezoelectric film is dx, the thermal conductivity of the heat dissipation film is Ci, the thickness of the heat dissipation film is di, a thermal conductivity ratio is Rx, De=w/p, and Rx=(Ce×de×De)/(Cx×dx+Ci×di).

2. The acoustic wave device according to claim 1, wherein the heat dissipation film is on the second main surface of the piezoelectric film and in contact with the support portion of the support substrate.

3. The acoustic wave device according to claim 2, wherein the heat dissipation film and the support substrate are integral with each other.

4. The acoustic wave device according to claim 1, wherein the heat dissipation film overlaps an entirety of the cavity portion in plan view.

5. The acoustic wave device according to claim 1, wherein the heat dissipation film includes a first portion that overlaps the first electrode or the second electrode in plan view and a second portion that overlaps a portion between the first electrode or the second electrode in plan view, and a thickness of at least portion of the second portion is larger than a thickness of the first portion.

6. The acoustic wave device according to claim 1, wherein the thermal conductivity of the heat dissipation film is equal to or more than about five times the thermal conductivity of the piezoelectric film.

7. The acoustic wave device according to claim 1, wherein Euler angles ($\varphi$, $\theta$, $\psi$) of the lithium niobate film or the lithium tantalate film as the piezoelectric film are within a range of expression (1), expression (2), or expression (3):

$$(0°±10°, 0° \text{ to } 20°, \text{any } \psi) \quad \text{expression (1);}$$

$(0°±10°, 20°$ to $80°, 0°$ to $60°(1-(θ-50)^2/900)^{1/2})$ or
$(0°±10°, 20°$ to $80°, [180°-60°(1-(θ-50)^2/900)^{1/2}]$ to $180°)$ expression (2); and $(0°±10°, [180°-30°(1-(ψ-90)^2/8100)^{1/2}]$ to $180°$, any $ψ)$ expression (3).

8. The acoustic wave device according to claim 1, wherein the thickness of the heat dissipation film is about 25% or less of the thickness of the piezoelectric film.

9. The acoustic wave device according to claim 1, wherein R≤4 is satisfied.

10. The acoustic wave device according to claim 9, wherein R≤1 is satisfied.

11. An acoustic wave device comprising:
a support substrate including a cavity portion and a support portion;
a piezoelectric film provided on the support portion to cover the cavity portion and including a first main surface and a second main surface that face away from each other;
a functional electrode on the first main surface of the piezoelectric film; and
a heat dissipation film on at least one of the first main surface and the second main surface of the piezoelectric film; wherein
the functional electrode includes at least one pair of first and second electrodes that face each other, dx/p is about 0.5 or less when dx is a thickness of the piezoelectric film and p is a middle-to-middle distance between the first electrode and the second electrode that are adjacent to each other, the heat dissipation film overlaps at least a portion of the support portion in plan view, a thickness of the heat dissipation film is smaller than a thickness of the piezoelectric film, and the heat dissipation film is a silicon film, a silicon nitride film, or a silicon carbide film;
the piezoelectric film is a lithium niobate film or a lithium tantalate film; and
R≤8 is satisfied when the middle-to-middle distance between the first electrode and the second electrode that are adjacent to each other is p, an average of widths of the first electrode and the second electrode is w, a duty ratio of the functional electrode is De, a thermal conductivity of the functional electrode is Ce, a thickness of the functional electrode is de, the thermal conductivity of the piezoelectric film is Cx, the thickness of the piezoelectric film is dx, the thermal conductivity of the heat dissipation film is Ci, the thickness of the heat dissipation film is di, a thermal conductivity ratio is Rx, De=w/p, and Rx=(Ce×de×De)/(Cx×dx+Ci×di).

12. The acoustic wave device according to claim 11, wherein R≤4 is satisfied.

13. The acoustic wave device according to claim 12, wherein R≤1 is satisfied.

14. The acoustic wave device according to claim 11, wherein the heat dissipation film is on the second main surface of the piezoelectric film and in contact with the support portion of the support substrate.

15. The acoustic wave device according to claim 14, wherein the heat dissipation film and the support substrate are integral with each other.

16. The acoustic wave device according to claim 11, wherein the heat dissipation film overlaps an entirety of the cavity portion in plan view.

17. The acoustic wave device according to claim 11, wherein the heat dissipation film includes a first portion that overlaps the first electrode or the second electrode in plan view and a second portion that overlaps a portion between the first electrode or the second electrode in plan view, and a thickness of at least portion of the second portion is larger than a thickness of the first portion.

18. The acoustic wave device according to claim 11, wherein the thermal conductivity of the heat dissipation film is equal to or more than about five times the thermal conductivity of the piezoelectric film.

19. The acoustic wave device according to claim 11, wherein Euler angles (φ, θ, ψ) of the lithium niobate film or the lithium tantalate film as the piezoelectric film are within a range of expression (1), expression (2), or expression (3):

$(0°±10°, 0°$ to $20°$, any $ψ)$ expression(1);

$(0°±10°, 20°$ to $80°, 0°$ to $60°(1-(θ-50)^2/900)^{1/2})$ or
$(0°±10°, 20°$ to $80°, [180°-60°(1-(θ-50)^2/900)^{1/2}]$ to $180°)$ expression(2); and $(0°±10°, [180°-30°(1-(ψ-90)^2/8100)^{1/2}]$ to $180°$, any $ψ)$ expression (3).

20. The acoustic wave device according to claim 11, wherein the thickness of the heat dissipation film is about 25% or less of the thickness of the piezoelectric film.

* * * * *